(12) United States Patent
Cody et al.

(10) Patent No.: US 7,608,526 B2
(45) Date of Patent: Oct. 27, 2009

(54) STRAINED LAYERS WITHIN SEMICONDUCTOR BUFFER STRUCTURES

(75) Inventors: Nyles W. Cody, Tempe, AZ (US); Christophe Figuet, Crolles (FR); Mark Kennard, Crolles (FR)

(73) Assignees: ASM America, Inc., Phoenix, AZ (US); S.O.I. Tec Silicon On Insulator Technologies, S.A., Bernin (FR)

( * ) Notice: Subject to any disclaimer, the term of this patent is extended or adjusted under 35 U.S.C. 154(b) by 504 days.

(21) Appl. No.: 11/491,616

(22) Filed: Jul. 24, 2006

(65) Prior Publication Data
US 2008/0017952 A1 Jan. 24, 2008

(51) Int. Cl.
*H01L 21/20* (2006.01)

(52) U.S. Cl. .................. 438/481; 438/222; 257/19; 257/190; 257/E21.092; 257/E21.182; 257/E21.207

(58) Field of Classification Search ................ 438/222, 438/481, 603; 257/19, 190, E21.092, E21.182, 257/E21.207, E29.193, E31.046, E31.049
See application file for complete search history.

(56) References Cited

U.S. PATENT DOCUMENTS

| | | | |
|---|---|---|---|
| 5,442,205 A | 8/1995 | Brasen et al. | |
| 5,445,897 A | 8/1995 | Satoh et al. | |
| 5,633,516 A | 5/1997 | Mishima et al. | |
| 5,847,409 A | 12/1998 | Nakayama | |
| 6,154,475 A | 11/2000 | Soref et al. | |
| 6,350,993 B1 | 2/2002 | Chu et al. | |
| 6,525,338 B2 | 2/2003 | Mizushima et al. | |
| 6,573,126 B2 | 6/2003 | Cheng et al. | |
| 6,953,736 B2 | 10/2005 | Ghyselen et al. | |
| 7,022,593 B2 | 4/2006 | Arena et al. | |
| 7,049,627 B2 | 5/2006 | Vineis et al. | |
| 7,390,725 B2 * | 6/2008 | Maa et al. | 438/458 |
| 7,402,504 B2 | 7/2008 | Brabant et al. | |
| 2003/0153161 A1 | 8/2003 | Chu et al. | |
| 2003/0157787 A1 | 8/2003 | Murthy et al. | |
| 2003/0230233 A1 | 12/2003 | Fitzgerald et al. | |
| 2004/0075105 A1 | 4/2004 | Leitz et al. | |
| 2004/0087117 A1 | 5/2004 | Leitz et al. | |
| 2004/0157409 A1 | 8/2004 | Ghyselen et al. | |

(Continued)

FOREIGN PATENT DOCUMENTS

EP 1 681 711 7/2006

OTHER PUBLICATIONS

Levinshtein, Michael E., Rumyantsev, Sergey L, and Shur, Michael S. *Properties of Advanced Semiconductor Materials GaN, AlN, InN, BN, SiC, SiGe*, John Wiley & Sons, Inc., 149-187 (2001).

(Continued)

*Primary Examiner*—Quoc D Hoang
(74) *Attorney, Agent, or Firm*—Knobbe Martens Olson & Bear, LLP (57) ABSTRACT

A semiconductor workpiece including a substrate, a relaxed buffer layer including a graded portion formed on the substrate, and at least one strained transitional layer within the graded portion of the relaxed buffer layer and method of manufacturing the same. The at least one strained transitional layer reduces an amount of workpiece bow due to differential coefficient of thermal expansion (CTE) contraction of the relaxed buffer layer relative to CTE contraction of the substrate

39 Claims, 5 Drawing Sheets

U.S. PATENT DOCUMENTS

| | | |
|---|---|---|
| 2004/0178406 A1 | 9/2004 | Chu |
| 2004/0219735 A1 | 11/2004 | Brabant et al. |
| 2005/0051795 A1 | 3/2005 | Arena et al. |
| 2005/0054175 A1 | 3/2005 | Bauer |
| 2005/0150447 A1 | 7/2005 | Ghyselen et al. |
| 2005/0170577 A1 | 8/2005 | Yao et al. |
| 2005/0191826 A1 | 9/2005 | Bauer et al. |
| 2006/0145188 A1 | 7/2006 | Dantz et al. |
| 2007/0264801 A1 | 11/2007 | Cody et al. |

OTHER PUBLICATIONS

Pending U.S. Appl. No. 11/267,494 entitled: Semiconductor Heterostructure and Method for Forming a Semiconductor Heterostructure, filed on Mar. 11, 2005 by Christophe Figuet and Mark Kennard.

Pending U.S. Appl. No. 11/146,572 entitled: Laminated Layer Structure and Method for Forming the Same, filed on Jun. 6, 2005 by Christophe Figuet.

Bolkhovityanov et al., "Artificial GeSi Substrates for Heteroepitaxy: Achievements and Problems," *Semiconductors* 37(5): 493-518 (2003).

Fitzgerald et al., "Totally Relaxed $Ge_xSi_{1-x}$ Layers with Low Threading Dislocation Densities Grown on Si Substrates," *Appl. Phys. Lett.* 59(7): 811-813 (1991).

International Preliminary Report on Patentability for International Application No. PCT/US2007/072252, dated Nov. 3, 2008.

Isella et al., "Low-energy plasma-enhanced chemical vapor deposition for strained Si and Ge heterostructures and devices" Solid State Electronics, Elsevier Science Publishers, Barking, GB, vol. 48, No. 8, Aug. 2004, pp. 1317-1323.

Obata et al., "Structural Characterization of $Si_{0.7}Ge_{0.3}$ Layers Grown on Si(001) Substrates by Molecular Beam Epitaxy," *J. Appl. Phys.* 81(1): 199-204 (1997).

Presting et al., "Buffer Concepts of Ultrathin $Si_mGe_n$ Superlattices" Thin Solid Films, Elsevier-Sequoia S.A. Lausanne, CH, vol. 222, No. 1/2, pp. 215-220 (1992).

Yamamoto et al., "Dislocation Structures and Strain-Relaxation in SiGe Buffer Layers on Si (0 0 1) Substrates with an Ultra-Thin Ge Interlayer," *Appl. Surface Sci.* 224: 108-112 (2004).

International Search Report and Written Opinion for PCT Application No. PCT/US2007/072252 dated Dec. 19, 2007.

\* cited by examiner

STRAINED LAYERS WITHIN SEMICONDUCTOR BUFFER STRUCTURES

BACKGROUND

1. Field

The present invention relates generally to the field of semiconductor manufacturing and more specifically to the formation of relaxed semiconductor buffer structures.

2. Description of the Related Art

Strained semiconductor materials advantageously provide improved electrical carrier mobility properties as compared to relaxed semiconductor materials, thus increasing the speed at which semiconductor circuits can operate. A semiconductor layer is said to be "strained" when it is constrained to have a lattice structure in at least one dimension that is the same as that of the underlying material's lattice structure, but different from the inherent lattice constant of the layer's material. Lattice strain occurs because the atoms in the deposited film depart from the positions normally occupied when the material is deposited over an underlying structure having a matching lattice structure. The degree of strain is related to several factors, including the thickness of the deposited layer and the degree of lattice mismatch between the deposited material and the underlying structure.

Strained semiconductor layers can be formed by epitaxially depositing silicon (Si) over a silicon-germanium (SiGe) buffer layer. Silicon-germanium films are used in a wide variety of semiconductor applications, such as in microelectronics fabrication. Because SiGe has a larger lattice constant than silicon, when epitaxial SiGe deposition occurs over silicon (such as during deposition on a silicon wafer), the epitaxially deposited SiGe is "strained" to the smaller underlying silicon lattice. If a strained silicon layer is to be deposited over the SiGe layer, the SiGe buffer layer should first be "relaxed" so that the silicon layer deposited thereover will be strained. In particular, because a strained SiGe layer has the dimensions of the underlying silicon lattice, a silicon layer deposited over a strained SiGe layer will not be strained. In contrast, a silicon layer deposited over a "relaxed" SiGe layer will be strained to conform to the larger underlying SiGe lattice. Thus, a strained silicon layer can be produced by epitaxially depositing silicon over a relaxed SiGe layer. There are a number of approaches to forming a relaxed SiGe layer over silicon.

In one approach, a SiGe layer is deposited beyond the "critical thickness." As the thickness of a strained SiGe layer increases beyond a certain critical thickness, defects in the crystal structure of the strained SiGe layer appear, thereby inducing relaxation. After relaxation occurs, the degree of strain present in the SiGe layer is related to the amount of misfit dislocation generated in the layer during relaxation, which is a function of the elastic energy of the layer and the activation energy for dislocation nucleation and gliding. The critical thickness depends on a variety of factors, including growth rates, growth temperature, germanium concentration, and the number of defects within the layer underlying the SiGe layer. The SiGe can also be relaxed, for example due to macroscopic expansion, by annealing the workpiece after deposition.

Typically, a SiGe relaxed buffer layer is deposited with an increasing (or "graded") concentration of germanium from the underlying silicon substrate to the top surface of the relaxed buffer layer. For example, the concentration of germanium can increase from about 0% to between about 20% and 40%. Grading the germanium concentration of the SiGe layer to gradually increase lattice constant with distance from the substrate facilitates relaxation and can minimize the generation of threading dislocations and pile-ups of threading dislocations ("pile-ups").

SUMMARY

In certain embodiments, a semiconductor workpiece comprises a substrate, a relaxed buffer layer including a graded portion formed on the substrate, and at least one strained transitional layer within the graded portion of the relaxed buffer layer.

In certain embodiments, a semiconductor workpiece comprises a substrate, a relaxed buffer layer formed on the substrate, and at least one strained transitional layer within the relaxed buffer layer, the at least one strained transitional layer configured to reduce a threading dislocation density proximate to a top surface of the relaxed buffer layer to less than about $10^4/cm^2$.

In certain embodiments, an integrated circuit comprises a substrate, a relaxed buffer layer including a graded portion formed on the substrate, and at least one strained transitional layer within the graded portion of the relaxed buffer layer.

In certain embodiments, a method of manufacturing a semiconductor workpiece comprises providing a substrate, depositing a relaxed buffer layer on the substrate, and during depositing the relaxed buffer layer, depositing at least one strained transitional layer configured to reduce a threading dislocation density proximate to a top surface of the relaxed buffer layer to less than about $10^4/cm^2$.

In certain embodiments, a method of manufacturing a semiconductor workpiece comprises providing a substrate, depositing a first portion of a relaxed buffer layer on the substrate by flowing silicon precursors and germanium precursors while increasing a germanium concentration in the growing first portion of the relaxed buffer layer, after depositing the first portion of the relaxed buffer layer, pausing flowing the germanium precursors while continuing to flow the silicon precursors, and, after pausing flowing the germanium precursors, depositing a second portion of the relaxed buffer layer by resuming flowing the germanium precursors and increasing a germanium concentration in the growing second portion of the relaxed buffer layer.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

These and other features, aspects, and advantages of the invention disclosed herein are described below with reference to the drawings of preferred embodiments, which are intended to illustrate and not to limit the invention.

DETAILED DESCRIPTION OF THE PREFERRED EMBODIMENTS

Although certain preferred embodiments and examples are disclosed below, it will be understood by those in the art that the invention extends beyond the specifically disclosed embodiments and/or uses of the invention and obvious modifications and equivalents thereof. Thus, it is intended that the scope of the invention herein disclosed should not be limited by the particular embodiments described below.

Figure 1A:
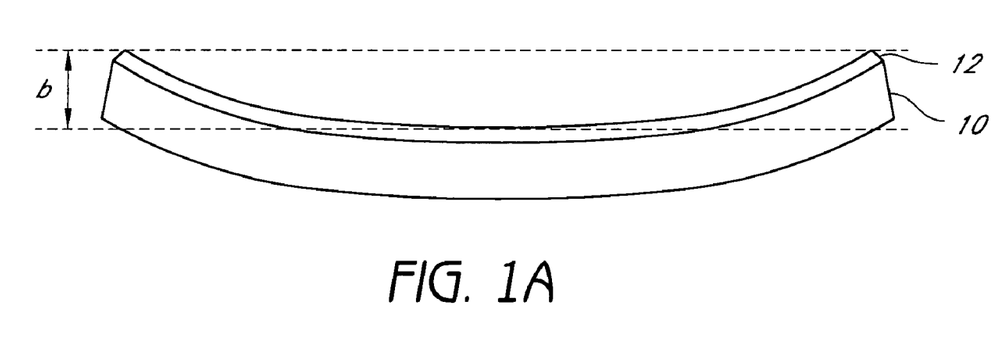
FIGS. 1A and 1B schematically depict workpiece bow due to a relaxed buffer layer.
Figure 1B:
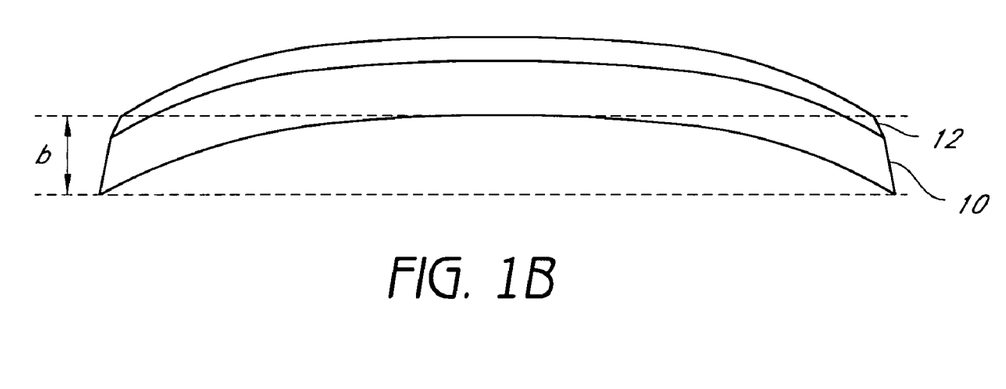

Relaxed buffer layers grown at high temperatures on a substrate can put a workpiece into a state of tensile or compressive strain that can create workpiece bow and warp upon cooling, due at least in part to differences in the coefficients of thermal expansion between the relaxed buffer layer and the bulk substrate. A relaxed buffer layer can cause bow when the workpiece is cooled (e.g., to room temperature) from a deposition temperature (e.g., 900° C.) because the relaxed buffer layer will contract according to its coefficient of thermal expansion a different amount than the bulk substrate will contract according to its coefficient of thermal expansion. The workpiece remains bowed and warped when the workpiece is below the stability temperature (i.e., the temperature below which the stress due to differences in the coefficients of thermal expansion does not cause substantially more bow). Warp is a measure of the maximum and minimum deviations of the surface of the workpiece relative to a reference plane. Bow is a measure of how concave (e.g., as depicted by FIG. 1A) or convex (e.g., as depicted by FIG. 1B) the deformation of the surface of the workpiece is at its center point versus its edges independent of any thickness variations. In FIG. 1A, the workpiece comprising a substrate 10 and a relaxed buffer layer 12 is compressively strained after cooling, causing upward bow (e.g., due to a relaxed SiGe buffer layer that has a larger coefficient of thermal expansion than silicon). In FIG. 1B, the workpiece comprising a substrate 10 and a relaxed buffer layer 12 is tensile strained after cooling, causing downward bow. Although workpiece bow is described in detail herein, the disclosed embodiments can similarly be applied to workpiece warp. Equation 1 mathematically describes the bow of a workpiece due to differences in coefficients of thermal expansion between a substrate and a layer grown on a substrate for temperature regimes in which the coefficients of thermal expansion are approximately independent of temperature, for example as a first order approximation at a relatively fixed temperature.

$$b \propto b_0 - H_f \cdot \left(\frac{d}{H_s}\right)^2 \cdot (\Delta\alpha \cdot \Delta T) \quad \text{(Eqn. 1)}$$

As described by Equation 1, workpiece bow (b) is proportional to the thickness of the grown layer ($H_f$), the square of the ratio of the substrate diameter (d) to the substrate thickness ($H_s$), the difference in coefficient of thermal expansion between the substrate and the grown layer ($\Delta\alpha = \alpha_s - \alpha_f$), and the difference ($\Delta T$) between the deposition temperature and the stability temperature, plus the initial amount of bow ($b_0$).

In general, the bulk substrate physical parameters are constant. For example, a bare substrate typically has an initial bow close to zero (e.g., about −5 μm to about +5 μm for 300 mm silicon substrates) because there is nothing present on the substrate to cause it to bow, such as a relaxed layer with a different coefficient of thermal expansion (i.e., $b_0 \approx 0$). The deposition temperature or temperatures are known from the process parameters. The stability temperature is the temperature below which the differences in the coefficients of thermal expansion of the substrate and the grown layer do not cause significant differential expansion or contraction. The stability temperature is typically room temperature (e.g., 25° C.), but may be between about 400° C. and 500° C.

The diameter of the substrate (d) is typically between about 50 and 450 millimeters, and the coefficient of thermal expansion of the substrate ($\alpha_s$) does not substantially depend on temperature in the temperature ranges of interest. The bulk thickness of the substrate ($H_s$) is typically thicker for larger diameter workpieces. For example, a 200 mm substrate is generally about 725 microns (μm) thick and a 300 mm substrate is generally about 750 μm thick. Increasing the diameter of the substrate or decreasing the thickness of the substrate will have a measurable affect on workpiece bow due to the squared proportionality. For example, changing the workpiece from 200 mm diameter and 725 μm thick to 300 mm and 750 μm thick, while keeping all other variables ($H_f$, $\Delta\alpha$, $\Delta T$) constant, can increase bow by 210%.

Wafer bow and warp can present numerous problems at subsequent process steps (e.g., steps after cooling the workpiece to room temperature) that can decrease the yield of the workpiece. Processing tools that perform an alignment may incorrectly orient the wafer, causing poor process uniformity between wafers and within each wafer. For example, photolithography tools may produce images that are misaligned. Bow and warp may also cause photolithography tools to produce images that are out of focus, which can produce incorrect patterns on the workpiece. Some process tools using vacuum handling may be unable to contact the wafer at all vacuum points, resulting in handling failure. Bow can also cause stress during the die grinding process that reduces dicing uniformity. In processes associating the top surfaces of two workpieces, for example the strained silicon-on-insulator (SSOI) process described below, bow may result in poor bonding between donor and receiving workpieces. Thus, the methods described herein below preferably reduce bow to less than about 50 μm, more preferably less than about 25 μm, and even more preferably less than about 5 μm in order for the workpieces to be bondable for 300 mm diameter substrates.

Bow and warp may disadvantageously increase due to the deposition of multiple layers. For example, the deposition of a strained active layer over a relaxed buffer layer over a substrate may cause strain, and thus bow and warp, due to the differences in the coefficients of thermal expansion between the relaxed buffer layer and the substrate and between the strained active layer and the relaxed buffer layer. The bow caused by such multiple layers can be mathematically described by Equation 2.

$$b_{fn} = b_0 - \frac{3}{4} \cdot \left(\frac{d}{H_s}\right)^2 \cdot \Delta T \cdot \left(\alpha_s \cdot \sum_n H_{fn} - \sum_n H_{fn} \cdot \alpha_n\right) \quad \text{(Eqn. 2)}$$

Bow ($b_{fn}$) equals the square of the ratio of the substrate diameter (d) to the substrate thickness ($H_s$), the difference ($\Delta T$) between the grown layer growth temperature and the stability temperature, and the product of the coefficient of thermal expansion for the bulk substrate ($\alpha_s$) and the sum of the thicknesses ($H_{fn}$) of each of n grown layers minus the sum of the products of the thicknesses ($H_{fn}$) of n grown layers and the coefficients of thermal expansion ($\alpha_{fn}$) for n grown layers, plus the initial amount of bow ($b_0$). Compared to Equation 1, the differences in coefficient of thermal expansion are expressed in combination with the thicknesses of the layers to represent the additive effects of the layers. It will be appreciated that Equation 2 reduces to Equation 1 for a single grown layer. In some embodiments, a plurality of grown layers may make the problems due to bow and warp described above worse.

The coefficient of thermal expansion ($\alpha_x$) for a SiGe relaxed buffer layer changes with the germanium concentration x, as described by Equations 3 and 4 for temperatures near room temperature. Equation 3 is generally accurate for germanium concentrations between 0% and 85% (i.e., 0<x<0.85). Equation 4 is generally accurate for germanium concentrations between 85% and 100% (i.e., 0.85<x<1). It will be appreciated that the equations may be different in other temperature ranges.

$$\alpha_x = (2.55 \cdot x + 2.6) \cdot 10^{-6}/K \quad \text{(Eqn. 3)}$$

$$\alpha_x = (7.53 \cdot x - 0.89) \cdot 10^{-6}/K \quad \text{(Eqn. 4)}$$

Insertion of Equations 3 and 4 into Equation 1 or 2 shows that higher germanium concentrations can lead to greater workpiece bow due to differences in coefficient of thermal expansion. Assuming that all other variables remain constant, the difference between the coefficient of thermal expansion of the substrate ($\alpha_s$) and the coefficient of thermal expansion for the deposited layer ($\alpha_f$) will be larger for silicon substrates as germanium concentration increases. For example, when the germanium concentration is 10%, application of Equation 1 yields a coefficient of thermal expansion ($\alpha_{0.10}$) of $2.86 \times 10^{-6}/K$, and when the germanium concentration is 40%, application of Equation 1 yields a coefficient of thermal expansion ($\alpha_{0.40}$) of $3.62 \times 10^{-6}/K$. Thus, for single grown layers of relaxed SiGe, the difference in thermal expansion ($\Delta\alpha$) from a silicon substrate with a coefficient of thermal expansion ($\alpha_s$) of $2.6 \times 10^{-6}/K$, will be $0.26 \times 10^{-6}/K$ for 10% germanium but will be $1.02 \times 10^{-6}/K$ for 40% germanium, thereby causing the magnitude of the workpiece bow (b) to increase by about 400% for an increase in germanium concentration from 10% to 40%.

Figure 2A:
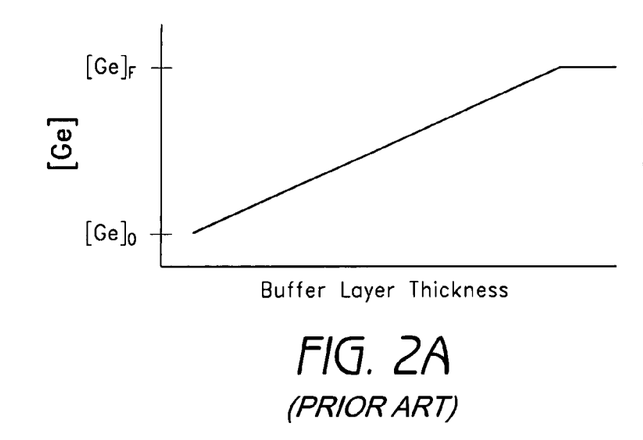
FIGS. 2A through 2G schematically depict example embodiments of germanium concentration profiles across a relaxed buffer layer.
Figure 2B:
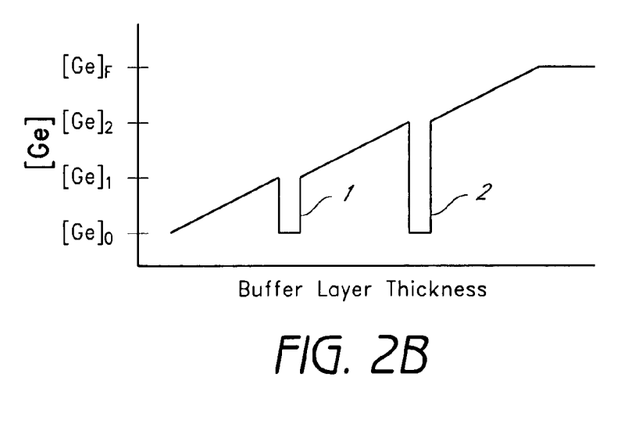
Figure 2C:
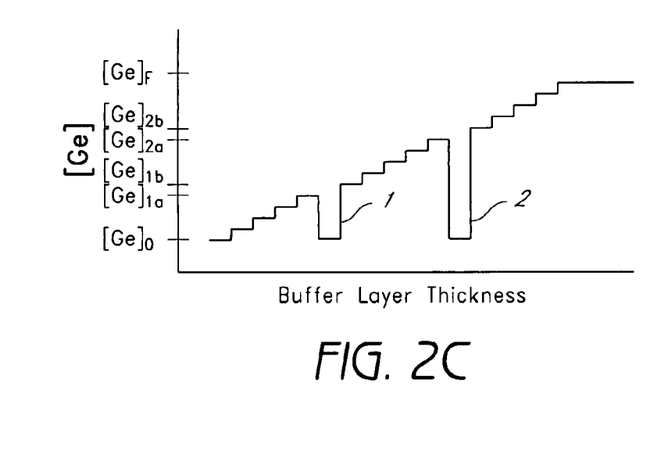
Figure 2D:
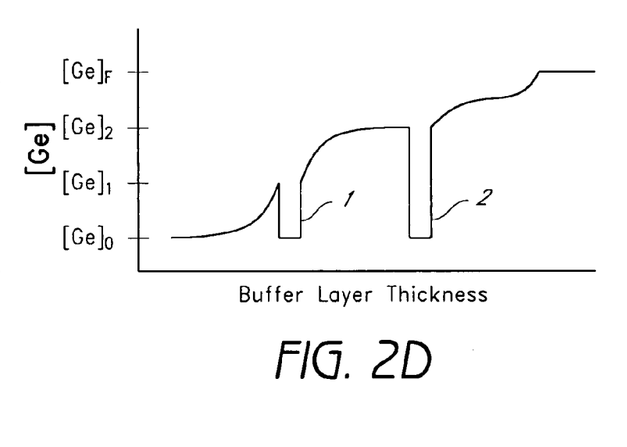
Figure 2E:
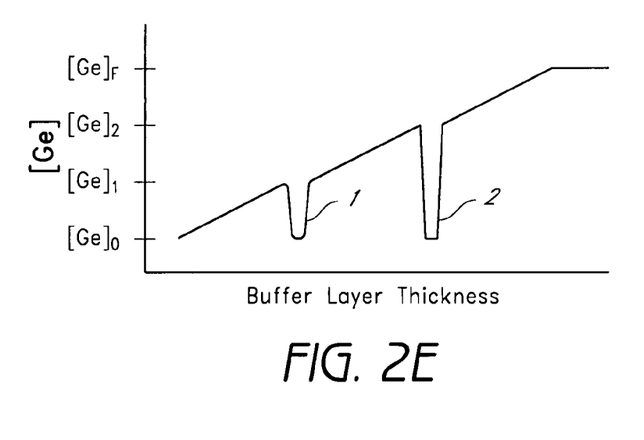
Figure 2F:
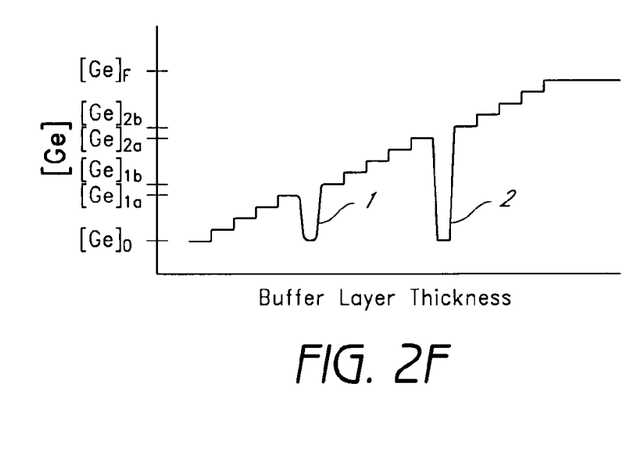
Figure 2G:
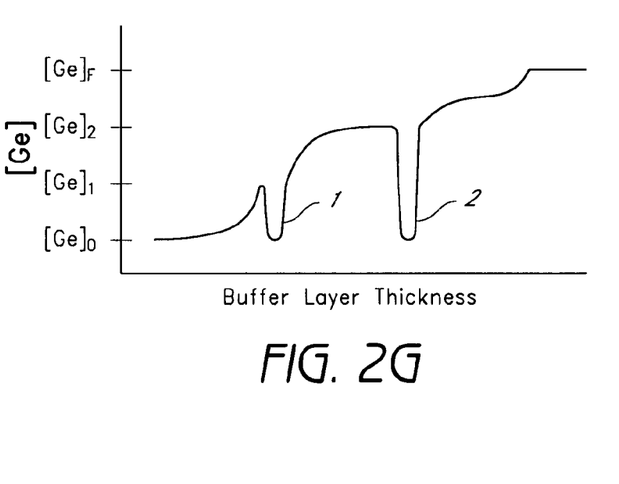

In certain embodiments, altering the properties of the relaxed buffer layer can change the amount of bow in a workpiece. For example, the amount of bow in a workpiece will increase if the thickness of the relaxed buffer layer ($H_f$) increases while holding the other variables constant. A SiGe relaxed buffer layer deposited over a silicon substrate may comprise a concentration of germanium at the interface between the substrate and the relaxed buffer layer that is low enough that the crystallographic structure of the relaxed buffer layer is substantially similar to the crystallographic structure of the substrate. The proportion of germanium may increase gradually (e.g., linearly as depicted in FIGS. 2A and 2B, stepwise as depicted in FIG. 2C, curved as depicted in FIG. 2D, combinations thereof, or any other suitable increases) through the thickness of the graded portion of the relaxed buffer layer from the substrate to the top surface of the graded portion of the relaxed buffer layer, although the increases in germanium proportion are low enough that the crystallographic structure of the relaxed buffer layer is not strained throughout its thickness. FIGS. 2E through 2G illustrate that the germanium concentration change from relaxed buffer layer to the strained transitional layers do not have to be immediate, but may be tapered (e.g., as illustrated by the strained transitional layers 2 in FIGS. 2E and 2F), curved (e.g., as illustrated by the strained transitional layers 1 in FIGS. 2E through 2G and the strained transitional layer 2 in FIG. 2G), etc. As described above, the relaxed buffer layer may comprise a non-graded portion (e.g., between about 1 and 3 µm), depicted in FIGS. 2A-2G as the substantially flat concentrations at each $[Ge]_F$.

Figure 3:
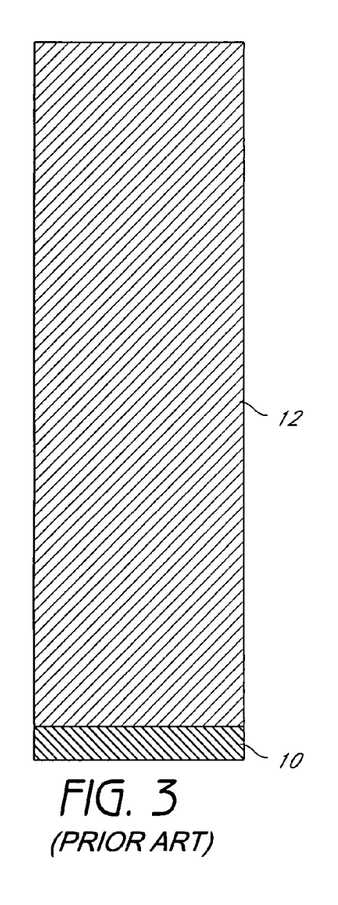
FIG. 3 is a schematic cross-section of a relaxed buffer layer.

FIG. 3 illustrates a partial schematic cross-section of an example workpiece comprising a substrate 10 and a relaxed buffer layer 12 increasing in germanium concentration from 0% to 40%. The substrate 10 is a silicon wafer with a diameter of 200 mm, a thickness of 725 µm, and a coefficient of thermal expansion of $2.6 \times 10^{-6}/K$. The relaxed buffer layer 12 has a thickness of 6.14 µm, a growth temperature of 900° C. (1173 K), and a stability temperature of 500° C. (773 K). Application of Equation 1 for the embodiment illustrated in FIG. 3 results in a bow of about 75 µm.

If the relaxed buffer layer 12 has a thickness of 7.5 µm, application of Equation 3 results in a bow of about 92 µm. That is, workpiece bow increases when the thickness of the relaxed buffer layer ($H_{fn}$) increases. In order to produce a relaxed buffer layer with a germanium concentration that gradually increases from the substrate interface to the top surface of the relaxed buffer layer, the relaxed buffer layer is usually thick enough to allow relaxation at the plurality of intermediate crystal structures resulting from the plurality of intermediate germanium concentrations. For example, a $Si_{0.6}Ge_{0.4}$ relaxed buffer layer is typically thicker than a $Si_{0.8}Ge_{0.2}$ relaxed buffer layer to allow gentle grading to the ultimate desired (e.g., upper surface) germanium concentration to minimize vertically propagating defect formation during relaxation. In some embodiments, a relaxed buffer layer comprising 20% germanium at the top surface is between about 3 and 5 µm thick. In some embodiments, a relaxed buffer layer comprising 30% germanium at the top surface is between about 4 and 6 µm thick. In some embodiments, a relaxed buffer layer comprising 40% germanium at the top surface is between about 5 and 7 µm thick. In some embodiments, a relaxed buffer layer comprising 60% germanium at the top surface is between about 6 and 8 µm thick. In some embodiments, a relaxed buffer layer comprising 80% germanium at the top surface is between about 7 and 9 µm thick. In some embodiments, a relaxed buffer layer comprising 100% germanium at the top surface is between about 8 and 10 µm thick.

In some embodiments, the relaxed buffer layer comprises a relaxed non-graded buffer segment or section comprising silicon and germanium having a substantially constant germanium concentration deposited on top of the graded portion of the relaxed buffer layer. The non-graded relaxed buffer segment generally has a germanium concentration corresponding to the germanium concentration at the top surface of the graded portion of the relaxed buffer layer such that the non-graded segment layer is substantially relaxed. The thickness of the non-graded buffer layer may be on the order of microns. For example, the thicknesses provided above for the relaxed buffer layer may include between about 1 and 3 μm (e.g., about 2 μm) of non-graded buffer segment.

The use of higher germanium concentrations can desirably make a strained active layer deposited on top of the relaxed buffer layer more strained because the crystal structure is more unlike the native crystal structure of silicon, thereby increasing the speed of devices formed in the strained active layer. Thus, although increases in device speed may desirably employ higher concentrations of germanium in relaxed buffer layers, higher concentrations of germanium may also undesirably result in increased workpiece bow due to both greater differences in coefficients of thermal expansion and a greater thickness of the relaxed SiGe buffer layer. Relaxed buffer layers may also be thicker for processes that transfer a strained active layer to another workpiece because the relaxed buffer layer is preferably thick enough to split, as described in detail below. Preferably, the non-graded portion of the relaxed buffer layer is thick enough to split (for example, and without limitation, at least 2 μm).

If the substrate 10 has a diameter of 300 mm and a thickness of 750 μm, and if the relaxed buffer layer 12 has a thickness of 6.14 μm, application of Equation 1 results in a bow of about 158 μm. That is, the bow is about 210% higher than the bow of a workpiece with a diameter of 200 mm. The problems associated with workpiece bow may become increasingly important because the historical trend in semiconductor manufacturing has been to utilize substrates with increasingly higher diameters. For example, increasing the substrate diameter to 450 mm and the substrate thickness to 800 μm would result in workpiece bow of about 312 μm for the structure of FIG. 3 (i.e., 417% higher than the bow for a substrate with a diameter of 200 mm).

In certain embodiments, the formation of at least one strained transitional layer within the graded portion of the relaxed buffer layer can reduce or counter workpiece bow due to differential coefficients of thermal expansion between the substrate and the relaxed buffer layer upon cooling below a stability temperature. As used herein, the term "counter" is to be given its broadest ordinary meaning, including, but not limited to, to oppose and to act in an opposite direction. That is, the strained transitional layer need not reduce the amount of bow to zero, but preferably reduces the amount of bow to a value sufficient to result in a workpiece that is suitable for further processing. In some embodiments, the strained transitional layer preferably counters bow to a value low enough to perform a SSOI process as described above. In some embodiments, the strained transitional layer counters bow by about 25%, 50%, 75%, or whatever amount makes the workpiece suitable for subsequent processing. The strained transitional layer may comprise the same material as the substrate, the same material as a strained active layer deposited on top of the relaxed buffer layer, or another material. For example, embodiments in which a SiGe relaxed buffer layer is deposited on a silicon substrate, the strained transitional layer may comprise strained silicon or another material. The configuration of the number, thickness, and positioning of the strained transitional layer may be determined based on the overall thickness and concentration of the relaxed buffer layer and the diameter of the workpiece.

Referring again to FIG. 2A, the germanium concentration gradually increases from $[Ge]_0$ to $[Ge]_F$ across the thickness of the graded portion of the relaxed buffer layer. Strained transitional layers 1, 2 (e.g., strained silicon) can be formed within the graded portion of the relaxed buffer layer in accordance with the present disclosure, for example as schematically depicted in FIGS. 2B through 2D. In FIG. 2B, the germanium concentration increases linearly from $[Ge]_0$ to $[Ge]_F$, with decreases back to $[Ge]_0$ in strained transitional layers 1, 2. In FIG. 2C, the germanium concentration increases stepwise from $[Ge]_0$ to $[Ge]_F$, with decreases back to $[Ge]_0$ in strained transitional layers 1, 2. In FIG. 2D, the germanium concentration increases in a curved fashion from $[Ge]_0$ to $[Ge]_F$, with decreases back to $[Ge]_0$ in strained transitional layers 1, 2. In certain preferred embodiments, $[Ge]_0$ is zero (i.e., there is no germanium at the interface between the relaxed buffer layer and the substrate or in the strained transitional layers 1, 2), although it will be appreciated that $[Ge]_0$ can be non-zero and the concentration in either or both of the strained transitional layers 1, 2 can be different from the initial relaxed buffer layer concentration $[Ge]_0$.

In some embodiments, the germanium concentration in a graded portion of the relaxed buffer layer at the bottom surface of the strained transitional layer is substantially the same as the germanium concentration in a graded portion of the relaxed buffer layer at the top surface of the strained transitional layer. For example, in FIGS. 2B and 2D, the concentration $[Ge]_1$ in the graded portion of the relaxed buffer layer is the same directly above and below the strained transitional layer 1, and the concentration $[Ge]_2$ in the graded portion of the relaxed buffer layer is the same directly above and below the strained transitional layer 2. In some embodiments, the germanium concentration in the graded portion of the relaxed buffer layer at the bottom surface of the strained transitional layer is different from the germanium concentration in the graded portion of the relaxed buffer layer at the top surface of the strained transitional layer. For example, in FIG. 2B, the concentration $[Ge]_{1a}$ in the graded portion of the relaxed buffer layer below the strained transitional layer 1 is different from the concentration $[Ge]_{1b}$ in the graded portion of the relaxed buffer layer above the strained transitional layer 1, and the concentration $[Ge]_{2a}$ in the graded portion of the relaxed buffer layer below the strained transitional layer 2 is different from the concentration $[Ge]_{2b}$ in the graded portion of the relaxed buffer layer above the strained transitional layer 2. It will be appreciated that the germanium concentration differences directly above and below the strained transitional layers 1, 2 in FIG. 2C are small enough that the graded portion of the relaxed buffer layer remains relaxed on either side of the transitional layers.

The germanium concentration in the relaxed buffer layer and the strained transitional layers may have any suitable profile such that the germanium concentration in the strained transitional layer is lower than the germanium concentration in the graded portion of the relaxed buffer layer at the top and bottom surfaces of that strained transitional layer (i.e., so the strained transitional layer is strained). For example, the concentration of germanium in one or both of the strained transitional layers 1, 2 in FIGS. 2B-2D may be above or below $[Ge]_0$.

In certain embodiments, the number of strained layers is between about one and eleven for a relaxed buffer layer that has a germanium concentration between about 1% and 100% at the top surface of the relaxed buffer layer. The ratio of silicon to germanium is thus between about 99:1 and 0:100. In certain embodiments, the number of strained layers is about one or two for a relaxed buffer layer that has a germanium concentration between about 15% and 25% at the top surface of the relaxed buffer layer. The ratio of silicon to germanium is thus between about 85:15 and 75:25. In certain embodiments, the number of strained transitional layers is about two or three for a relaxed buffer layer with a germanium concentration between about 25% and 35% at the top surface of the relaxed buffer layer. The ratio of silicon to germanium is thus between about 75:25 and 65:35. In certain embodiments, the number of strained transitional layers is between about three and five for a relaxed buffer layer with a germanium concentration between about 35% and 45% at the top surface of the relaxed buffer layer. The ratio of silicon to germanium is thus between about 65:35 and 55:45. In certain embodiments, the number of strained transitional layers is between about four and six for a relaxed buffer layer with a germanium concentration between about 45% and 55% at the top surface of the relaxed buffer layer. The ratio of silicon to germanium is thus between about 55:45 and 45:55. In certain embodiments, the number of strained transitional layers is between about five and seven for a relaxed buffer layer with a germanium concentration between about 55% and 65% at the top surface of the relaxed buffer layer. The ratio of silicon to germanium is thus between about 45:55 and 35:65. In certain embodiments, the number of strained transitional layers is between about six and eight for a relaxed buffer layer with a germanium concentration between about 65% and 75% at the top surface of the relaxed buffer layer. The ratio of silicon to germanium is thus between about 35:65 and 25:75. In certain embodiments, the number of strained transitional layers is between about seven and nine for a relaxed buffer layer with a germanium concentration between about 75% and 85% at the top surface of the relaxed buffer layer. The ratio of silicon to germanium is thus between about 25:75 and 15:85. In certain embodiments, the number of strained transitional layers is between about nine and eleven for a relaxed buffer layer with a germanium concentration between about 85% and 95% at the top surface of the relaxed buffer layer. The ratio of silicon-to-germanium is thus between about 15:85 and 5:95. It will be appreciated that the ratios of silicon to germanium may be different if the relaxed buffer layer comprises other elements.

The quantity of strained transitional layers may be higher for substrates with larger diameters. For example, the quantities provided above may be appropriate for workpieces with a diameter of 200 mm, but an additional strained transitional layer may be formed for workpieces with diameters of 300 mm and two additional strained transitional layers may be formed for workpieces with diameters of 450 millimeters. The quantity of strained transitional layers can also be selected based on the thickness of the relaxed buffer layer and/or the deposition temperature.

The thickness of the strained transitional layer is generally thin compared to the thickness of the relaxed buffer layer. As deposited, the buffer layer is relaxed because the changes in internal lattice stress due to different germanium concentrations are gradual enough that the buffer layer may relax during deposition at each of the plurality of concentration changes. However, the transitional layer is strained because the internal lattice stress difference due to the abrupt change (e.g., back to $[Ge]_0$) in does not allow the transitional layer to relax. That is, the transitional layer adopts the crystal lattice of the layer on which it is formed. The buffer layer formed on top of the strained transitional layer also adopts the crystal lattice of the layer on which it is formed, so it is also relaxed because the crystal lattice of the strained transitional layer matches the relaxed buffer layer below it (e.g., $[Ge]_1$).

For a given germanium concentration in a SiGe relaxed buffer layer, the critical thickness of a strained silicon transitional layer decreases as the deposition temperature of the SiGe relaxed buffer layer increases. For a given deposition temperature of a SiGe relaxed buffer layer, the critical thickness of a strained silicon transitional layer decreases as the germanium concentration in the SiGe relaxed buffer layer increases. If the thickness of the strained transitional layer is greater than the critical thickness, defects may occur at the top and/or bottom interfaces between the strained transitional layer and the relaxed buffer layer, thereby inducing relaxation. Thus, the critical thickness for a strained transitional layer in a SiGe relaxed buffer layer with a high germanium concentration grown at a high temperature (e.g., 900° C.) is low. In some embodiments, the critical thickness of the strained silicon transitional layers is less than 100 Å (0.01 µm, 10 nm), less than 80 Å (0.008 µm, 8 nm), less than 50 Å (0.005 µm, 5 nm), or less than 20 Å (0.002 µm, 2 nm). In some embodiments, the preferred thickness of the strained transitional layer is between about 10 Å (0.001 µm, 1 nm) and 100 Å (0.01 µm, 10 nm), between about 40 Å (0.004 µm, 4 nm) and 90 Å (0.009 µm, 9 nm), or between about 60 Å (0.006 µm, 6 nm) and 80 Å (0.008 µm, 8 nm).

Positioning of the strained transitional layer also depends on the thickness and concentration of the graded portion of the relaxed buffer layer. In certain embodiments, the strained transitional layers are positioned roughly evenly spaced throughout the thickness of the graded portion of the relaxed buffer layer. In some embodiments, the strained transitional layers change in proportion to germanium concentration in the graded portion of the relaxed buffer layer. In certain embodiments, the strained transitional layers are formed within the graded portion of the relaxed buffer layer at variable intervals. For example, a single strained transitional layer may be placed at approximately 3.07 µm from the substrate if the graded portion of the relaxed buffer layer is 6.14 µm thick. For another example, four strained transitional layers may be placed at approximately 1.0 µm, 2.1 µm, 3.1 µm, and 3.7 µm from the substrate if the graded portion of the relaxed buffer layer is 6.14 µm thick.

As described above, the critical thickness of the strained transitional layers deposited within a SiGe relaxed buffer layer depends in part on the germanium concentration. Process parameters may limit the controllable thickness of the strained transitional layers, and thus formation of strained transitional layers at lower germanium concentrations may result in increased process control. In certain preferred embodiments, the strained transitional layers are not positioned proximate to the top of the graded portion of the relaxed buffer layer.

Figure 4:
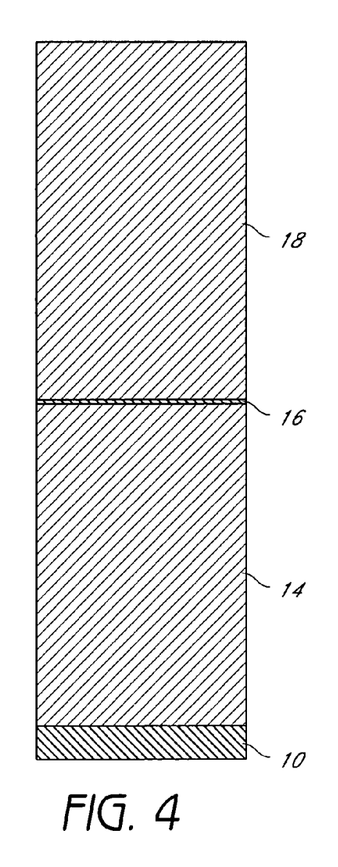
FIG. 4 is a schematic cross-section of a relaxed buffer layer with one strained transitional layer.

FIG. 4 illustrates an embodiment of a workpiece in accordance with the present invention where the relaxed buffer layer and the strained transitional layer are deposited at about at 900° C. (1173 K). The workpiece comprises a substrate 10, a first portion of a SiGe relaxed buffer layer 14 linearly increasing in germanium concentration from 0% proximate to the substrate 10 to 20% at the top surface of the first portion of the relaxed buffer layer 14, a strained silicon transitional layer 16, and a second portion of the SiGe relaxed buffer layer 18 linearly increasing in germanium concentration from 20% proximate to the strained transitional layer 16 to 40% at the top surface of the second portion of the relaxed buffer layer 18. The first portion 14 of the SiGe relaxed buffer layer has a thickness of 3.07 µm from the substrate 10 to the strained transitional layer 16. The strained transitional layer 16 has a thickness of 40 Å (0.004 µm, 4 nm). The second portion 18 of the SiGe relaxed buffer layer has a thickness of 3.07 µm from the strained transitional layer 16 to the top surface of the SiGe relaxed buffer layer. The inclusion of the strained silicon transitional layer within the SiGe relaxed buffer layer reduces the amount of workpiece bow to approximately 55 µm. Other configurations can reduce the amount of workpiece bow to approximately 20 µm or lower. As noted above, the manner of grading can be other than linear.

Figure 5:
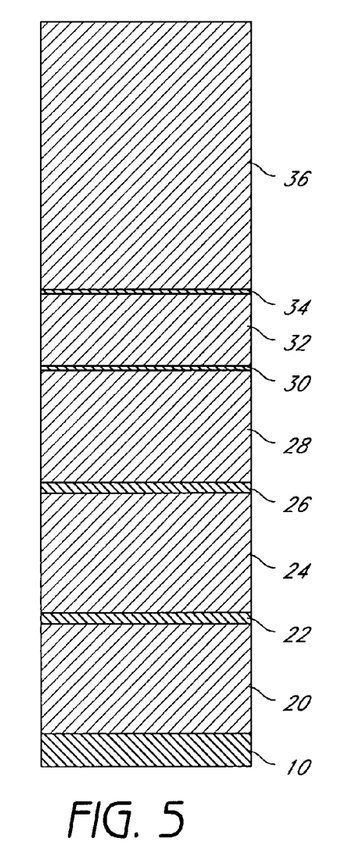
FIG. 5 is a schematic cross-section of a relaxed buffer layer with four strained transitional layers.

FIG. 5 illustrates another embodiment of a workpiece in accordance with the present invention where the relaxed buffer layer and the strained transitional layers are deposited at about at 900° C. (1173 K). The workpiece comprises a substrate 10, a first portion of a SiGe relaxed buffer layer 20 linearly increasing in germanium concentration from 0% proximate to the substrate 10 to 6.5% at the top surface of the first portion of the relaxed buffer layer 20, a first strained transitional layer 22, a second portion of the SiGe relaxed buffer layer 24 linearly increasing in germanium concentration from 6.5% proximate to the first strained transitional layer 22 to 13.7% at the top surface the second portion of the relaxed buffer layer 24, a second strained transitional layer 26, a third portion of the SiGe relaxed buffer layer 28 linearly increasing in germanium concentration from 13.7% proximate to the second strained transitional layer 26 to 20.2% at the top surface of the third portion of the relaxed buffer layer 28, a third strained transitional layer 30, a fourth portion of the SiGe relaxed buffer layer 32 linearly increasing in germanium concentration from 20.2% proximate to the third strained transitional layer 30 to 24.1% at the top surface of the fourth portion of the relaxed buffer layer 32, a fourth strained transitional layer 34, and a fifth portion of the SiGe relaxed buffer layer 36 linearly increasing in germanium concentration from 24.1% proximate to the fourth strained transitional layer 34 to 40% at the top surface of the fifth portion of the relaxed buffer layer 36. The first portion 20 of the SiGe relaxed buffer layer has a thickness of 1.0 μm from the substrate 10 to the first strained transitional layer 22. The first strained transitional layer 22 has a thickness of 65 Å (0.0065 μm, 6.5 nm). The second portion 24 of the SiGe relaxed buffer layer has a thickness of 1.07 μm from the first strained transitional layer 22 to the second strained transitional layer 26. The second strained transitional layer 26 has a thickness of 78 Å (0.0078 μm, 7.8 nm). The third portion 28 of the SiGe relaxed buffer layer has a thickness of 1.02 μm from the second strained transitional layer 26 to the third strained transitional layer 30. The third strained transitional layer 30 has a thickness of 73 Å (0.0073 μm, 7.3 nm). The fourth portion 32 of the SiGe relaxed buffer layer has a thickness of 0.63 μm from the third strained transitional layer 30 to the fourth strained transitional layer 34. The fourth strained transitional layer 34 has a thickness of 69 Å (0.0069 μm, 6.9 nm). The fifth portion 36 of the SiGe relaxed buffer layer has a thickness of 2.42 μm from the fourth strained transitional layer 34 to the top surface of the SiGe relaxed buffer layer. The deposition of the four strained silicon transitional layers within the SiGe relaxed buffer layer reduces the amount of workpiece bow to approximately 20 μm. Other configurations can reduce the amount of workpiece bow to approximately 10 μm.

In a preferred embodiment, the relaxed buffer layer is grown in a single-wafer epitaxial deposition reactor, for example the Epsilon® 3000 (for 300 mm workpieces) from ASM America, Inc. of Phoenix, Ariz. More preferably, the relaxed buffer layer including strained transitional layers is grown within the epitaxial deposition reactor. In certain embodiments in which the relaxed buffer layer comprises SiGe, the germanium concentration may be linearly increased within each portion (or "segment") of the relaxed buffer layer by adjusting deposition parameters. For example, the temperature of the deposition may be adjusted and/or, more preferably, the flow of reactants comprising silicon precursors may be reduced, the flow of reactants comprising germanium precursors may be increased. Examples of reactants comprising silicon precursors include, but are not limited to, silane, disilane, trisilane, chlorosilane, and dichlorosilane. Examples of reactants comprising germanium precursors include, but are not limited to, germane, digermane, chlorogermane, and dichlorogermane. In embodiments in which the deposition is performed at high temperatures, thereby inducing higher bow as described above, precursors comprising chlorine are preferred.

In certain embodiments in which the relaxed buffer layer comprises SiGe and the strained transitional layer comprises strained silicon, the strained silicon transitional layer can be formed in situ in an epitaxial deposition reactor by pausing flowing the reactants comprising germanium precursors, for example by shunting the reactants comprising germanium precursors to vent or stopping the flow of the reactants comprising germanium precursors. In certain embodiments, "pausing" flowing the reactants comprising germanium precursors still allows the deposition of silicon germanium, for example due to a relatively low flow of reactants comprising germanium precursors or an amount of reactants comprising germanium precursors remaining in the reactant lines. In certain embodiments, the duration of depositing the strained transitional layer is preferably between about 0.1 and 10 seconds and is more preferably between about 0.5 and 5 seconds. In some embodiments, the duration of depositing the strained transitional layer is at least one rotation (e.g., an integer number of rotations) of a rotatable susceptor holding the workpiece in the deposition chamber. In certain embodiments, the germanium concentration in the graded portion of the relaxed buffer layer is substantially the same proximate to the bottom of the strained transitional layer as the germanium concentration in the graded portion of the relaxed buffer layer proximate to the top of the strained transitional layer, for example by using the same deposition parameters before and after the deposition of the strained transitional layer. Deposition of strained transitional layers using previously existing semiconductor processing equipment desirably represents low integration costs and the in situ deposition of the strained transitional layers does not substantially affect the throughput of the reactor or increase the cost of the workpiece.

Figure 6A:
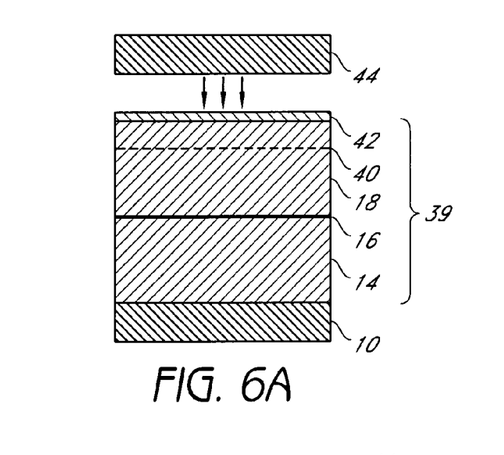
FIGS. 6A through 6D schematically depict an example schematic embodiment of a strained layer transfer process.
Figure 6B:
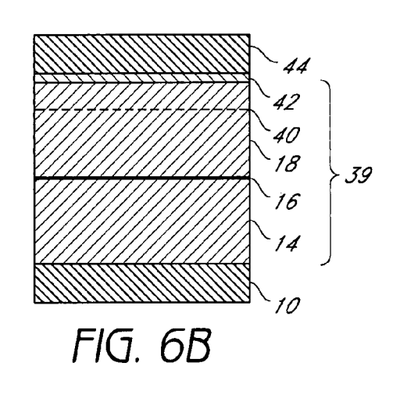
Figure 6C:
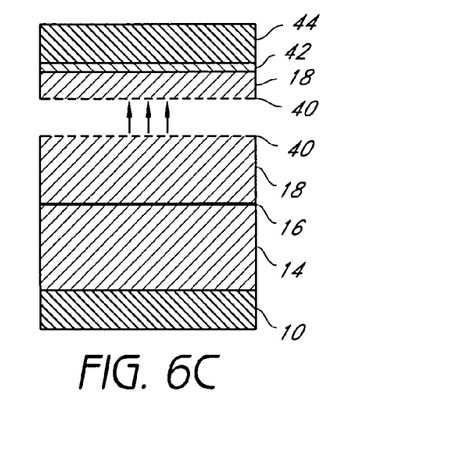
Figure 6D:
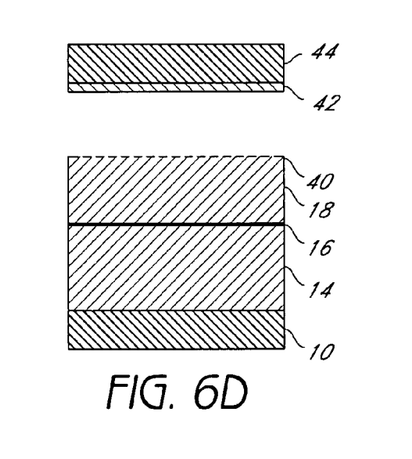

A strained active layer may be deposited on the surface of the relaxed buffer layer. FIG. 6A illustrates a partial schematic cross-section of an example workpiece comprising a substrate 10, relaxed SiGe buffer layer portions 14, 18 both increasing in germanium concentration with distance from the substrate 10, a strained silicon transitional layer 16, and a strained active layer 42. Together, the relaxed SiGe buffer layer portions 14, 18 and the strained transitional layer 16 form a buffer layer structure 39. In certain embodiments, the strained active layer 42 is transferred from a donor workpiece to a receiving substrate (or "handle wafer") 44. After the strained active layer 42 is deposited, a region of weakness can be created in the donor workpiece, for example by implanting hydrogen (e.g., H$^+$, H$_2^+$) to a specific depth. FIG. 6A shows a region of weakness 40 in the relaxed buffer layer 18. However, the region of weakness may be anywhere within the donor workpiece, for example and without limitation in the relaxed buffer layer 14, the strained transitional layer 16, and the substrate 10. In some embodiments, a further layer (e.g., an insulating layer comprising, for example, SiO$_2$, tetraethylorthosilicate (TEOS), silicon nitride (e.g., Si$_3$N$_4$), silicon oxynitride (SiO$_x$N$_y$)) (not shown) is deposited on the strained active layer 42 prior to association. After the strained active layer 42 is deposited, the donor workpiece can be associated with (or "bonded to") the receiving substrate 44 to form a composite structure (e.g., as depicted in FIG. 6B). The region of weakness 40 is configured to facilitate splitting of the composite structure. The composite structure can be split in the region of weakness 40 in the relaxed buffer layer 18, resulting in a donor workpiece comprising a portion of the relaxed buffer layer 18 and a receiving substrate 44 with a strained active layer 42 (e.g., as depicted in FIG. 6C). If the receiving substrate 44 has some of the relaxed buffer layer 18 on it, a polishing, etchback, or other suitable process may be used to leave only the strained active layer 42 (e.g., as depicted in FIG. 6D). The region of weakness 40 is preferably in the relaxed buffer layer 18 because the donor workpiece can be reused in such embodiments by depositing a second strained active layer on the remaining relaxed buffer layer 18 (e.g., after creating a second area of weakness). In some embodiments including an insulating layer, the insulator remains so as to be the insulator portion of a SSOI device. In some other embodiments including an insulating layer, the insulator protects the surface of the workpiece during formation of the region of weakness 40, and is removed before bonding. SSOI processes for creating a region of weakness, associating the donor workpiece to the receiving substrate, and splitting the composite structure are described in detail in U.S. Pat. No. 6,953,736, issued Oct. 11, 2005, entitled "Process for Transferring a Layer of Strained Semiconductor Material," incorporated herein by reference in its entirety.

In certain embodiments, bow and warp present problems when attempting to associate a donor workpiece comprising a strained active layer and a receiving substrate. Assuming that the amount of bow in the receiving substrate is about 0 µm, the amount of bow in the donor workpiece is preferably below 50 µm, more preferably below 25 µm, and even more preferably below 5 µm for 300 mm diameter substrates. As an example, a donor workpiece comprising a 6.14 µm relaxed buffer layer comprising $Si_{0.6}Ge_{0.4}$ at the top surface (as depicted in FIG. 3) may have an amount of bow of about 75 µm, and thus would not be suitable for association with a receiving substrate. The formation of at least one strained transitional layer in accordance with the embodiments described herein can advantageously decrease the amount of bow, thereby making the donor workpiece suitable for association with a receiving substrate.

Additionally, the implantation generally penetrates the workpiece to a constant distance from the workpiece surface. Formation of at least one strained transitional layer can advantageously affect the uniformity of the depth of the implant that creates the area of weakness, which penetrates the workpiece a constant distance from the surface, is substantially more planar without workpiece bow and warp. The strained active layer 16 may thereby help to concentrate the implanted species (e.g., hydrogen) around the region of weakness 40 and can thereby lead to lower surface roughness after splitting, which may enhance the effects of a subsequent etch (e.g., a selective etch) designed to remove residual SiGe from the receiving substrate 44. In certain embodiments, the position of the strained transitional layer 16 and the energy of the implantation are selected such that the implanted species (e.g., hydrogen) concentrate around the position of the strained transitional layer 16.

In certain embodiments, the at least one strained transitional layer exists in an integrated circuit, for example and without limitation after being cut from a workpiece processed in accordance with certain embodiments described herein. As an example, in certain embodiments an integrated circuit comprises a substrate, a relaxed buffer layer including a graded portion formed on the substrate, and at least one strained transitional layer within the graded portion of the relaxed buffer layer. In some embodiments, for example when the strained transitional layer is transferred by SSOI, portions of the relaxed buffer layer and/or the stained transitional layers may be removed (e.g., by etchback, polishing, etc.) before further processing of the workpiece.

Defects in traditional relaxed buffer layers can lead to threading dislocation densities (TDD) of between about $10^4/cm^2$ and $10^5/cm^2$ in the relaxed buffer layers. In certain embodiments, the at least one strained transitional layer described herein helps to reduce TDD proximate to a top surface of the relaxed buffer layer to less than $10^4/cm^2$. In some embodiments, the at least one strained transitional layer helps to reduce TDD proximate to a top surface of the relaxed buffer layer by about an order of magnitude (e.g., to below about $4\times10^3/cm^2$). For example, depositing three strained transitional layers within a relaxed buffer layer comprising $Si_{0.8}Ge_{0.2}$ on a 300 mm wafer can lead to TDD below approximately $10^4/cm^2$ in the relaxed buffer layer. In another example, depositing two strained transitional layers within a relaxed buffer layer comprising $Si_{0.8}Ge_{0.2}$ on a 200 mm wafer can lead to TDD below approximately $10^4/cm^2$ in the relaxed buffer layer. It will be appreciated that a strained active layer deposited over a relaxed buffer layer with a low TDD can result in a strained active layer with a substantially similar level of defectivity if the strained active layer is less than about its critical thickness. For example, depositing a strained active layer over a relaxed buffer layer comprising $Si_{0.8}Ge_{0.2}$ and three strained transitional layers on a 300 mm wafer can lead to TDD below approximately $10^4/cm^2$ in the strained active layer. In another example, depositing a strained active layer over a relaxed buffer layer comprising $Si_{0.8}Ge_{0.2}$ and two strained transitional layers on a 200 mm wafer can lead to TDD below approximately $10^4/cm^2$ in the strained active layer. Therefore, the insertion of strained transitional layers may also be useful to reduce defects in workpieces that are not detrimentally bowed and/or warped (e.g., workpieces with low germanium concentrations).

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. A method of manufacturing a semiconductor workpiece, the method comprising:
   providing a substrate;
   depositing a relaxed buffer layer on the substrate; and
   during depositing the relaxed buffer layer, depositing at least one strained transitional layer wherein depositing the relaxed buffer layer comprises depositing silicon and germanium in an epitaxial deposition reactor, wherein depositing the relaxed buffer layer comprises:
   depositing a first portion of the relaxed buffer layer by flowing silicon and germanium precursors, a germanium concentration in the first portion of the relaxed buffer layer increasing as the first portion of the relaxed buffer layer is deposited;

after depositing the first portion of the relaxed buffer layer, depositing a first strained transition layer by pausing flowing the germanium precursors; and after depositing the first strained transition layer, depositing a second portion of the relaxed buffer layer by resuming flowing the germanium precursors, a germanium concentration in the second portion of the relaxed buffer layer increasing as the second portion of the relaxed buffer layer is deposited.

2. The method of claim 1, further comprising cooling the workpiece, wherein the at least one strained transitional layer is configured to reduce workpiece bow due to differential thermal contraction of the relaxed buffer layer relative to the substrate during cooling.

3. The method of claim 1, further comprising cooling the workpiece, wherein the at least one strained transitional layer tends to counter an amount of stresses in the workpiece due to differential coefficient of thermal expansion (CTE) contraction of the relaxed buffer layer relative to CTE contraction of the substrate during cooling.

4. The method of claim 1, wherein depositing the at least one strained transitional layer comprises depositing silicon in the epitaxial deposition reactor.

5. The method of claim 1, wherein depositing the at least one strained transitional layer comprises depositing silicon and germanium in the epitaxial deposition reactor, the germanium concentration lower in the at least one strained transitional layer than at the surfaces of the relaxed buffer layer proximate to the at least one strained transitional layer.

6. The method of claim 1, wherein a highest germanium concentration in the relaxed buffer layer is between about 15% and 25%.

7. The method of claim 6, wherein depositing the relaxed buffer layer comprises depositing one to two strained transitional layers.

8. The method of claim 1, wherein depositing the relaxed buffer layer further comprises:

after depositing the second portion of the relaxed buffer layer, depositing a second strained transition layer by pausing flowing the germanium precursors; and after depositing the second strained transition layer, depositing a third portion of the relaxed buffer layer by resuming flowing the germanium precursors, a germanium concentration in the third portion of the relaxed buffer layer increasing as the third portion of the relaxed buffer layer is deposited.

9. The method of claim 1, wherein a highest germanium concentration in the relaxed buffer layer is between about 25% and 35%.

10. The method of claim 9, wherein depositing the relaxed buffer layer comprises depositing two to three strained transitional layers.

11. The method of claim 1, wherein a highest germanium concentration in the relaxed buffer layer is between about 35% and 45%.

12. The method of claim 11, wherein depositing the relaxed buffer layer comprises depositing three to five strained transitional layers.

13. The method of claim 1, wherein the at least one strained transitional layer is configured to reduce the threading dislocation density to less than about $4 \times 10^3/cm^2$.

14. The method of claim 1, further comprising depositing a strained active layer on the relaxed buffer layer.

15. The method of claim 14, wherein the strained active layer comprises silicon.

16. The method of claim 14, wherein the strained active layer has a threading dislocation density less than about $10^4/cm^2$.

17. The method of claim 14, wherein the strained active layer has a threading dislocation density less than about $4 \times 10^3/cm^2$.

18. The method of claim 14, further comprising transferring the strained active layer to a receiving substrate.

19. The method of claim 18, wherein transferring the strained active layer to the receiving substrate comprises:

after depositing the strained active layer, creating a region of weakness in the relaxed buffer layer, the region of weakness configured to facilitate splitting of the workpiece;

after depositing the strained active layer, associating the receiving substrate with the strained active layer to form a composite structure; and splitting the composite structure at the region of weakness in the relaxed buffer layer.

20. The method of claim 19, wherein creating a region of weakness in the relaxed buffer layer comprises implanting with hydrogen.

21. The method of claim 1, wherein depositing the relaxed buffer layer comprises:

depositing a germanium concentration in the relaxed buffer layer proximate to a bottom surface of the at least one strained transitional layer; and depositing the germanium concentration in the relaxed buffer layer proximate to a top surface of the at least one strained transitional layer.

22. An integrated circuit manufactured by the method of claim 1.

23. A method of manufacturing a semiconductor workpiece, the method comprising:

providing a substrate;

depositing a first portion of a relaxed buffer layer on the substrate by flowing silicon precursors and germanium precursors while increasing a germanium concentration in the growing first portion of the relaxed buffer layer;

after depositing the first portion of the relaxed buffer layer, pausing flowing the germanium precursors while continuing to flow the silicon precursors; and after pausing flowing the germanium precursors, depositing a second portion of the relaxed buffer layer by resuming flowing the germanium precursors and increasing a germanium concentration in the growing second portion of the relaxed buffer layer.

24. The method of claim 23, wherein increasing the germanium concentration in the growing first portion of the relaxed buffer layer comprises reducing flowing the silicon precursors.

25. The method of claim 23, wherein increasing the germanium concentration in the growing first portion of the relaxed buffer layer comprises increasing flowing the germanium precursors.

26. The method of claim 23, wherein a duration of pausing flowing the germanium precursors is between about 0.1 and 10 seconds.

27. The method of claim 23, wherein a duration of pausing flowing the germanium precursors is between about 0.5 and 5 seconds.

28. The method of claim 23, wherein a duration of pausing flowing the germanium precursors is a time for a rotatable susceptor holding the workpiece to rotate at least once.

29. The method of claim 23, wherein pausing flowing the germanium precursors comprises depositing strained silicon.

30. The method of claim 29, wherein the deposited strained silicon is between about 1 and 10 nm thick.

31. The method of claim 29, wherein the deposited strained silicon is between about 6 and 8 nm thick.

32. The method of claim 23, wherein pausing flowing the germanium precursors comprises depositing strained silicon germanium.

33. The method of claim 23, further comprising depositing a strained active layer on the relaxed buffer layer.

34. The method of claim 33, wherein the strained active layer comprises silicon.

35. The method of claim 33, further comprising transferring the strained active layer to a receiving substrate.

36. The method of claim 35, wherein transferring the strained active layer to the receiving substrate comprises:
  before depositing the strained active layer, creating a region of weakness in the relaxed buffer layer, the region of weakness configured to facilitate splitting of the workpiece;
  after depositing the strained active layer, associating the receiving substrate with the strained active layer to form a composite structure; and
  splitting the composite structure at the region of weakness in the relaxed buffer layer.

37. The method of claim 36, wherein creating the region of weakness in the relaxed buffer layer comprises implanting with hydrogen.

38. The method of claim 23, wherein depositing the second portion of the relaxed buffer layer comprises flowing the germanium precursors such that a germanium concentration in the first portion of the relaxed buffer layer proximate to a bottom surface of the strained transitional layer is substantially the same as a germanium concentration in the second portion of the relaxed buffer layer proximate to a top surface of the strained transitional layer.

39. An integrated circuit manufactured by the method of claim 23.

* * * * *

UNITED STATES PATENT AND TRADEMARK OFFICE
CERTIFICATE OF CORRECTION

PATENT NO.       : 7,608,526 B2                          Page 1 of 1
APPLICATION NO.  : 11/491616
DATED            : October 27, 2009
INVENTOR(S)      : Cody et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 599 days.

Signed and Sealed this

Twelfth Day of October, 2010

David J. Kappos
*Director of the United States Patent and Trademark Office*